United States Patent
Shibata et al.

(10) Patent No.: US 7,518,293 B2
(45) Date of Patent: Apr. 14, 2009

(54) PIEZOELECTRIC THIN-FILM ELEMENT

(75) Inventors: Kenji Shibata, Tsukuba (JP); Fumihito Oka, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 11/756,687

(22) Filed: Jun. 1, 2007

(65) Prior Publication Data

US 2007/0278904 A1      Dec. 6, 2007

(30) Foreign Application Priority Data

Jun. 5, 2006     (JP)    ............................. 2006-156319

(51) Int. Cl.
  *H01L 41/16*  (2006.01)
(52) U.S. Cl. ........................ 310/358; 310/357; 310/311
(58) Field of Classification Search .................. 310/358
  See application file for complete search history.

(56) References Cited

U.S. PATENT DOCUMENTS

| | | | |
|---|---|---|---|
| 5,719,607 A * | 2/1998 | Hasegawa et al. ............. | 347/70 |
| 2005/0006618 A1 * | 1/2005 | Nanao et al. ............ | 252/62.9 R |
| 2005/0030126 A1 * | 2/2005 | Inoue et al. ................. | 333/133 |
| 2005/0079735 A1 * | 4/2005 | Higuchi et al. .............. | 438/785 |
| 2005/0155202 A1 * | 7/2005 | Higuchi et al. ............. | 29/25.35 |

FOREIGN PATENT DOCUMENTS

| JP | 2001-196892 | 7/2001 |
|---|---|---|
| JP | 2002-068835 | 3/2002 |
| JP | 2002-151754 | 5/2002 |
| JP | 2004-224627 | 8/2004 |
| JP | 2006-124251 | 5/2006 |
| JP | 2007-287918 | 11/2007 |

* cited by examiner

*Primary Examiner*—Thomas M Dougherty
*Assistant Examiner*—Bryan P Gordon
(74) *Attorney, Agent, or Firm*—Antonelli, Terry, Stout & Kraus, LLP.

(57) ABSTRACT

A piezoelectric thin-film element formed with a niobate lithium potassium sodium thin-film having a well-developed Perovskite structure and having an excellent piezoelectric characteristic. The piezoelectric thin-film 4 is a dielectric thin-film composed of a alkaline-niobic oxide represented by $(Na_{x1}K_{y1}Li_{z1})NbO_3$ ($0<x1<1$, $0<y1<1$, $0\leq z1<1$, $x1+y1+z1=1$) and having a Perovskite structure, and the base dielectric thin film 6 composed of a alkaline-niobic oxide represented by $(Na_{x2}K_{y2}Li_{z2})NbO_3$ ($0<x2<1$, $0<y2<1$, $0\leq z2<1$, $x2+y2+z2=1$) and having a Perovskite structure is provided between the lower electrode 3 and the piezoelectric thin-film 4.

17 Claims, 5 Drawing Sheets

PIEZOELECTRIC THIN-FILM ELEMENT

BACKGROUND OF THE INVENTION

The present invention relates to a piezoelectric thin-film element formed with niobate lithium potassium sodium thin-film having a well-developed Perovskite structure having an excellent piezoelectric characteristic.

A piezoelectric component is formed into various kinds of piezoelectric elements according to various purposes, and generally used as functional electronic part such as actuators for generating a displacement in response to the applied voltage and sensors for generating a voltage in response to the mechanical displacement of the element.

As for the piezoelectric component used for the actuators and sensors, ferroelectric substance composed of lead-based materials having an excellent piezoelectric characteristic, especially erovskite-type ferroelectric substances based on $Pb(Zr_{1-x}Ti_x)O3$, called PZT, are generally used. This piezoelectric component is typically formed by sintering the oxide composed of individual elements.

As various electronic parts are made down-sized and sophisticated today, down-sizing and sophistication of the piezoelectric component is also required. In the piezoelectric materials formed by the conventional process mainly including a sintering method, however, in attempting to make the thickness of the material smaller especially near 100 μm, the thickness becomes the dimension equivalent to the size of the crystal grains forming the material, and thus, the effect due to this dimensional condition may not be negligible, which leads to such a problem that the dispersion and degradation in the characteristics becomes distinguished.

In order to solve above described problem, the recent research effort is directed to a method for forming piezoelectric components by applying thin-film technologies in stead of sintering method (see Japanese Patent Laid-Open Number 2002-151754). As an example, PZT thin-films formed by RF spattering method are recently developed and practically applied to a head actuator for high-definition and high-speed ink jet printers.

SUMMARY OF THE INVENTION

As the sintered piezoelectric component and the piezoelectric thin-film composed of PZT include lead oxide (PbO) by 60 to 70 weight %, those components are not preferable from the ecological point of view and from the point of view for the environmental pollution prevention. In order to meet the environmental requirement, it is desirable to develop such a piezoelectric component as not including Pb. There are various Pb-free piezoelectric components under research and development, including niobate lithium potassium sodium (General Formula: $(Na_xK_yLi_z)$ $NbO_3$ (($0<x<1$, $0<y<1$, $0\leq z<1$, $x+y+z=1$)). This niobate lithium potassium sodium thin-film is a material having a Perovskite structure, which is expected to be a strong candidate as Pb-free piezoelectric material because this material has a relatively good piezoelectric characteristic for Pb-free material.

In order to establish an excellent piezoelectric characteristic by using a niobate lithium potassium sodium thin-film, it is required to form a polycrystalline or monocrystalline thin film having a well-developed Perovskite structure with the potassium composition y being about 0.5. However, in case that the potassium composition is larger (y>0.4), there is such a problem that it is difficult to establish the crystal having a well-developed Perovskite structure for the niobate lithium potassium sodium thin-film and that a good insulation property for the thin-film can not be assured. In addition, in case that the potassium composition is larger (y>0.4), there is also such a problem that the surface irregularity of the thin-film becomes larger and that micro-mechanical processing may be difficult.

Thus, a niobate lithium potassium sodium thin-film having a well-developed Perovskite structure with the potassium composition, y, being about 0.5, which is expected to provide an excellent piezoelectric characteristic, can not realized practically. It is appreciated that any piezoelectric thin-film element having an excellent piezoelectric characteristic can not realized ever by using niobate lithium potassium sodium.

An object of the present invention is to solve the above problem and to provide a piezoelectric thin-film element formed with a niobate lithium potassium sodium thin-film having a well-developed Perovskite structure and having an excellent piezoelectric characteristic.

In order to achieve the above object, the present invention provides a piezoelectric thin-film element having a lower electrode, a piezoelectric thin-film and an upper electrode arranged on a substrate, in which said piezoelectric thin-film is a dielectric thin-film composed of a alkaline-niobic oxide represented by $(Na_{x1}K_{y1}Li_{z1})$ $NbO_3$ ($0<x1<1$, $0<y1<1$, $0\leq z1<1$, $x1+y1+z1=1$) and having a Perovskite structure, and a base dielectric thin film composed of a alkaline-niobic oxide represented by $(Na_{x2}K_{y2}Li_{z2})$ $NbO_3$ ($0<x2<1$, $0<y2<1$, $0\leq z2<1$, $x2+y2+z2=1$) and having a Perovskite structure is provided between said lower electrode and said piezoelectric thin-film.

The potassium composition of said base dielectric thin-film, y2, may be 0.4 or smaller, and the potassium composition of said piezoelectric thin-film, y1, may be 0.4 or larger.

The present invention provides a piezoelectric thin-film element having a lower electrode, a piezoelectric thin-film and an upper electrode arranged on a substrate, in which said piezoelectric thin-film is a dielectric thin-film composed of a alkaline-niobic oxide represented by $(Na_xK_yLi_z)$ $NbO_3$ ($0<x<1$, $0<y<1$, $0\leq z<1$, $x+y+z=1$) and having a Perovskite structure, and the potassium composition of said piezoelectric thin-film, y, gradually increases in the thickness direction of the lower electrode.

Said potassium composition of said piezoelectric thin-film, y, may increase in the range below 0.4 and over 0.4.

Said piezoelectric thin-film has a Perovskite structure with a crystalline structure of tetragonal system or orthorhombic system, and its crystal is polycrystalline or monocrystalline, which has a dominant orientation in either of (001) crystal plane, (100) crystal plane, (010) crystal plane and (111) crystal plane.

Said substrate may be either of a magnesium oxide substrate, a silicon substrate, a glass substrate, a stainless substrate, a copper substrate and an aluminum substrate.

The present invention provides such an excellent effect as described below.

(1) It will be appreciated that the present invention provides a niobate lithium potassium sodium thin-film having a well-developed Perovskite structure. and electro-optical elements.

DETAILED DESCRIPTION OF THE PREFERRED EMBODIMENTS

Now, referring to the attached figures, the preferred embodiments of the present invention will be described below.

Figure 1:
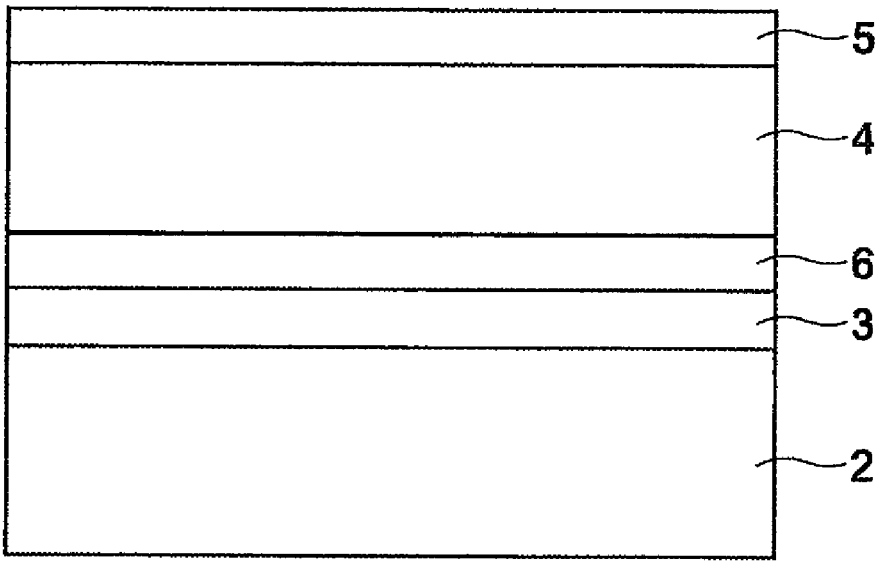
FIG. 1 is a cross-sectional view of piezoelectric thin-film element one embodiment of the present invention.

As shown in FIG. 1, the piezoelectric thin-film element 1 according to the present invention, having a lower electrode 3, a piezoelectric thin-film 4 and an upper electrode 5 arranged on a substrate 2, is a dielectric thin-film in which said piezoelectric thin-film 4 is composed of a alkaline-niobic oxide represented by $(Na_xK_yLi_z)$ $NbO_3$ ($0<x<1$, $0<y<1$, $0\leq z<1$, $x+y+z=1$) and having a Perovskite structure, and a base dielectric thin-film 6 composed of a alkaline-niobic oxide represented by $(Na_{x2}K_{y2}Li_{z2})$ $NbO_3$ ($0<x<1$, $0<y2<1$, $0\leq z2<1$, $x2+y2+z2=1$) and having a Perovskite structure is provided between said lower electrode 3 and said piezoelectric thin-film.

As described above, y1>y2. This means that the base dielectric thin-film 6 is a niobate lithium potassium sodium thin-film having a potassium composition smaller than the potassium composition in the piezoelectric thin-film 4.

Preferably, the potassium composition, y2, in the base dielectric thin-film 6 is 0.4 or smaller ($y2\leq 0.4$). In contrast, the potassium composition, y1, in the piezoelectric thin-film 4 is larger than 0.4 and substantially about 0.5.

Now, the operation and effect of the present invention will be described.

A niobate lithium potassium sodium thin-film having a relatively smaller potassium composition ($y\leq 0.4$) can easily form an thin-film having a well-developed Perovskite structure, and a niobate lithium potassium sodium thin-film having a relatively larger potassium composition (that is, y is 0.5 exactly or about 0.5) can also easily form an thin-film having a well-developed Perovskite structure. Thus, by forming the base dielectric thin-film 6 having a Perovskite structure with a smaller potassium composition above the lower electrode 3 and forming the piezoelectric thin-film 4 with a larger potassium composition above the base dielectric thin-film 6, the piezoelectric thin-film 4 results in a niobate lithium potassium sodium thin-film having a well-developed Perovskite structure.

Thus, a piezoelectric thin-film having an excellent piezoelectric characteristic can be realized by using niobate lithium potassium sodium. As this piezoelectric thin-film is Pb-free, it is useful from the ecological point of view and from the point of view for the environmental pollution prevention.

Though there are other several materials to be used for forming easily a well-developed Perovskite structure other than niobate lithium potassium sodium with relatively small potassium composition, in case of applying those materials to the base dielectric thin-film 6, the crystalline structure of the piezoelectric thin-film 4 becomes degraded because the lattice constants of those materials are subtly different from the lattice constants of niobate lithium potassium sodium used in the piezoelectric thin-film 4.

As for the method for forming the piezoelectric thin-film 4 and the base dielectric thin-film 6, sputtering method, CVD method, PLD method and coating method are used. BY using those methods, it will be appreciated that a high-quality and high-density crystalline thin-film can be formed.

It is allowed that a little amount of additive materials can be mixed in the piezoelectric thin-film 4 and the base dielectric thin-film 6, in which case, it will be appreciated that the similar effect to that provided by the above embodiment can be obtained.

The piezoelectric thin-film 4 has a Perovskite structure with a crystalline structure of tetragonal system or orthorhombic system, and its crystal is polycrystalline or monocrystalline, which has a dominant orientation in either of (001) crystal plane, (100) crystal plane, (010) crystal plane and (111) crystal plane.

The substrate 2 may be either of a magnesium oxide substrate, a silicon substrate, a glass substrate, a stainless substrate, a copper substrate and an aluminum substrate.

In this embodiment as described above, the piezoelectric thin-film 4 with a relatively large potassium composition is formed above the base dielectric thin-film 6 formed in advance with a relatively smaller potassium composition. Alternatively, it is allowed to make the potassium composition have a continuous gradient in the thickness direction of the thin-film in stead of making the potassium composition have a step-wise change in the thickness direction of the thin-film. Also, it is allowed to make the potassium composition have multiple step-wise increases in the thin-film.

The base dielectric thin-film 6 may not be formed, and the piezoelectric thin-film 4 may be formed as a dielectric thin-film composed of a alkaline-niobic oxide represented by $(Na_xK_yLi_z)$ $NbO_3$ ($0<x<1$, $0<y<1$, $0\leq z<1$, $x+y+z=1$) and having a Perovskite structure, and the potassium composition of this piezoelectric thin-film, y, may be 0.4 or below at the neighboring area of the lower electrode 3, and the potassium composition of this piezoelectric thin-film, y, may be continuously or step-wise made increase in the thickness direction of the thin-film, and thus, the overall potassium composition of this piezoelectric thin-film, y, may be larger than 0.4, preferably about 0.5.

In the structure described above, as the potassium composition at the neighboring area of the lower electrode 3 is small, the thin-film having a well-developed Perovskite structure can be formed easily, and as a thin-film with a potassium composition increasing in the thickness direction can be formed above the thin-film having a well-developed Perovskite structure, the resultant piezoelectric thin-film 4 may have a well-developed Perovskite structure over the thickness direction of the overall piezoelectric thin-film 4.

In one embodiment, a piezoelectric thin-film element 1 may be so formed as to have a structure in which the upper electrode 5 is removed from the structure shown in FIG. 1 and have a piezoelectric thin-film 4 composed of $(Na_{0.47}K_{0.47}Li_{0.06})$ $NbO_3$ having a thickness of 3 μm.

MgO-based substrate having a (001) crystal plane, a square dimension of 20 mm×20 mm and a thickness of 0.5 mm is used as the substrate 2. The platinum-based lower electrode 3 having a (001) single-oriented crystal plane and a thickness of 0.2 μm may be formed above the MgO-based substrate 2 by RF magnetron spattering method, and next, the base dielectric thin-film 6 composed of $(Na_{0.47}K_{0.47}Li_{0.06})$ $NbO_3$ thin-film having a Perovskite structure, a (001) single-oriented crystal plane and a thickness of 0.1 μm may be formed, and finally, the piezoelectric thin-film 4 composed of $(Na_{0.47}K_{0.47}Li_{0.06})NbO_3$ thin-film having a thickness of 3.0 μm.

The conditions for forming the platinum-based lower electrode 3 include the substrate temperature of 700° C., the discharge power of 200 W, the pressure of Ar gas atmosphere of 2.56 Pa and the film-development time of 10 minutes.

The conditions for forming the base dielectric thin-film 6 and the piezoelectric thin-film 4 include the substrate temperature of 700° C., the discharge power of 100 W, the pressure of Ar gas atmosphere of 0.4 Pa, the film-development time of 3 minutes for the base dielectric thin-film 6 and the film-development time of 3 hours and 30 minutes for the piezoelectric thin-film 4.

Figure 2:
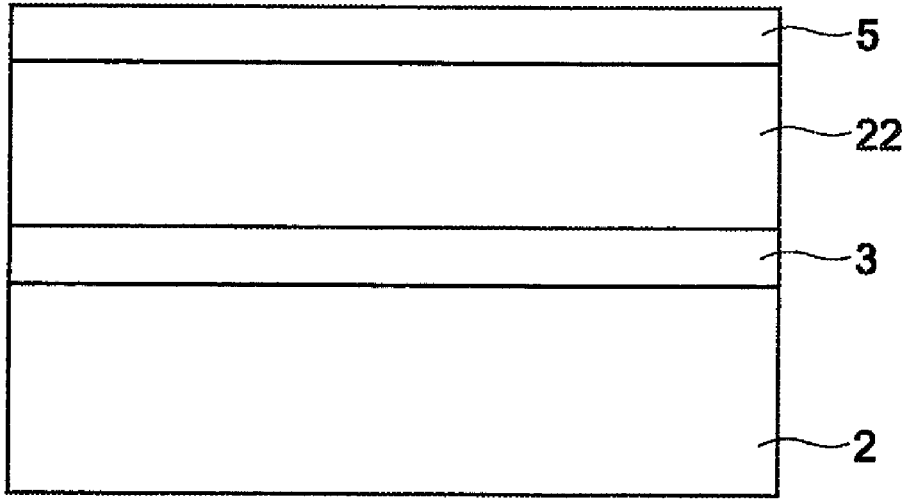
FIG. 2 is a cross-sectional view of piezoelectric thin-film element in prior art.

In contrast, in case of forming the piezoelectric thin-film element by applying the conventional technology, the piezoelectric thin-film element 21 may be composed of the substrate 2, the lower electrode 3, the piezoelectric thin-film 22 and the upper electrode 5 as shown in FIG. 2.

As an example in case of applying the conventional technology, the piezoelectric thin-film element 21 may be so formed as to have a structure in which the upper electrode 5 is removed from the structure shown in FIG. 2 and have a piezoelectric thin-film 22 having a thickness of 3 μm.

MgO-based substrate having a (001) crystal plane, a square dimension of 20 mm×20 mm and a thickness of 0.5 mm is used as the substrate 2. The platinum-based lower electrode 3 having a (001) single-oriented crystal plane and a thickness of 0.2 μm and the piezoelectric thin-film 22 composed of $(Na_{0.47}K_{0.47}Li_{0.06})NbO_3$ thin-film having a thickness of 3.0 μm may be formed above the MgO-based substrate 2 by RF magnetron spattering method.

The conditions for forming the platinum-based lower electrode 3 include the substrate temperature of 700° C., the discharge power of 200 W, the pressure of Ar gas atmosphere of 2.56 Pa and the film-development time of 10 minutes.

The conditions for forming the piezoelectric thin-film 22 include the substrate temperature of 700° C., the discharge power of 100 W, the pressure of Ar gas atmosphere of 0.4 Pa, the film-development time of 3 hours and 30 minutes.

Figure 3:
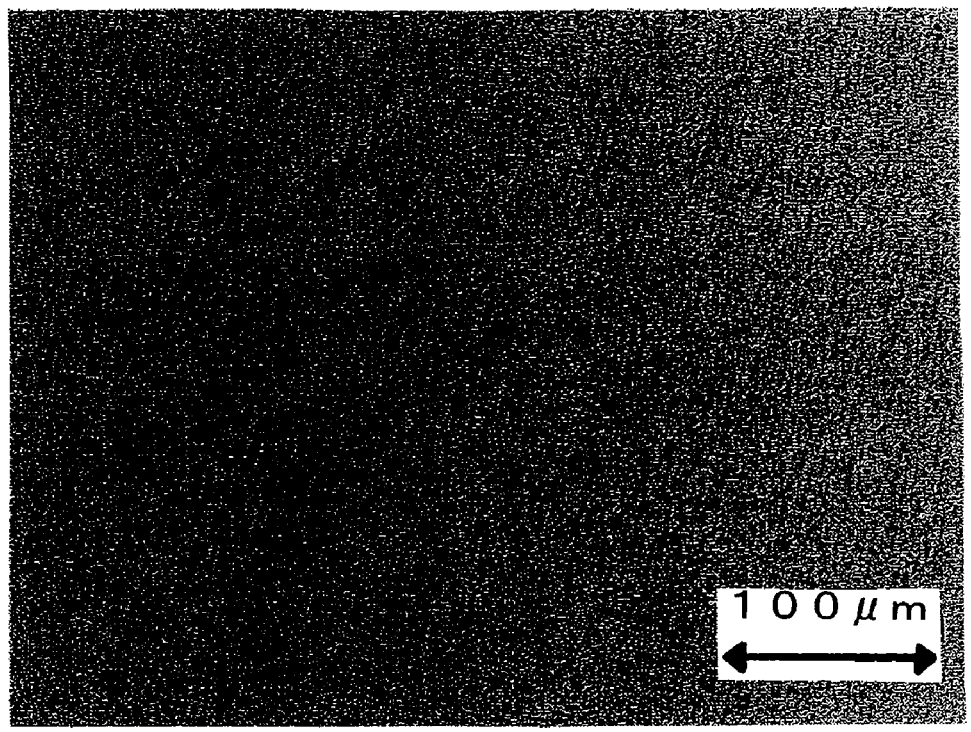
FIG. 3 is a plan view showing the surface state of the piezoelectric thin-film before forming the upper electrode of the piezoelectric thin-film element in one embodiment.
Figure 4:
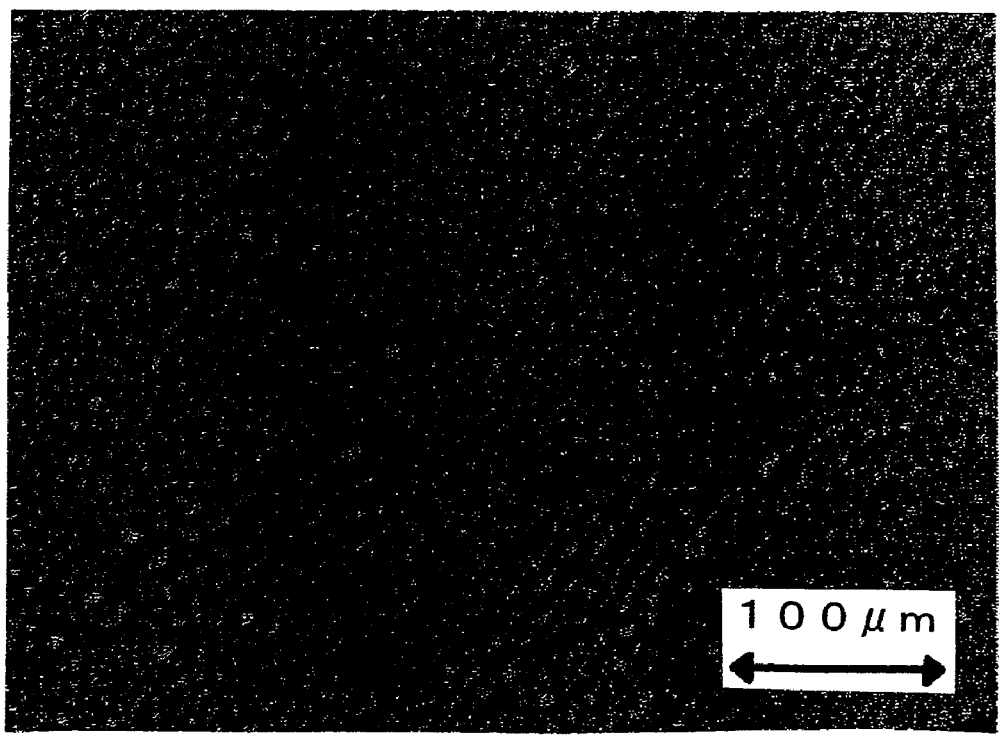
FIG. 4 is a plan view showing the surface state of the piezoelectric thin-film before forming the upper electrode of the piezoelectric thin-film element in prior art.

At first, the surface states of the piezoelectric thin-films 4 and 22 in this embodiment and the prior art, respectively, were observed by the optical microscope. FIG. 3 shows the surface state of the piezoelectric thin-film in this embodiment, and FIG. 4 shows the surface state of the piezoelectric thin-film in the prior art. Though the piezoelectric thin-film 22 in the prior art has many protruding parts and is resultantly shaped in convex and concave surfaces, the piezoelectric thin-film 4 in this embodiment has no protruding part and is resultantly shaped in unrelieved and smooth surfaces. Thus, it is proved that the present invention can improve the surface state.

Figure 5:
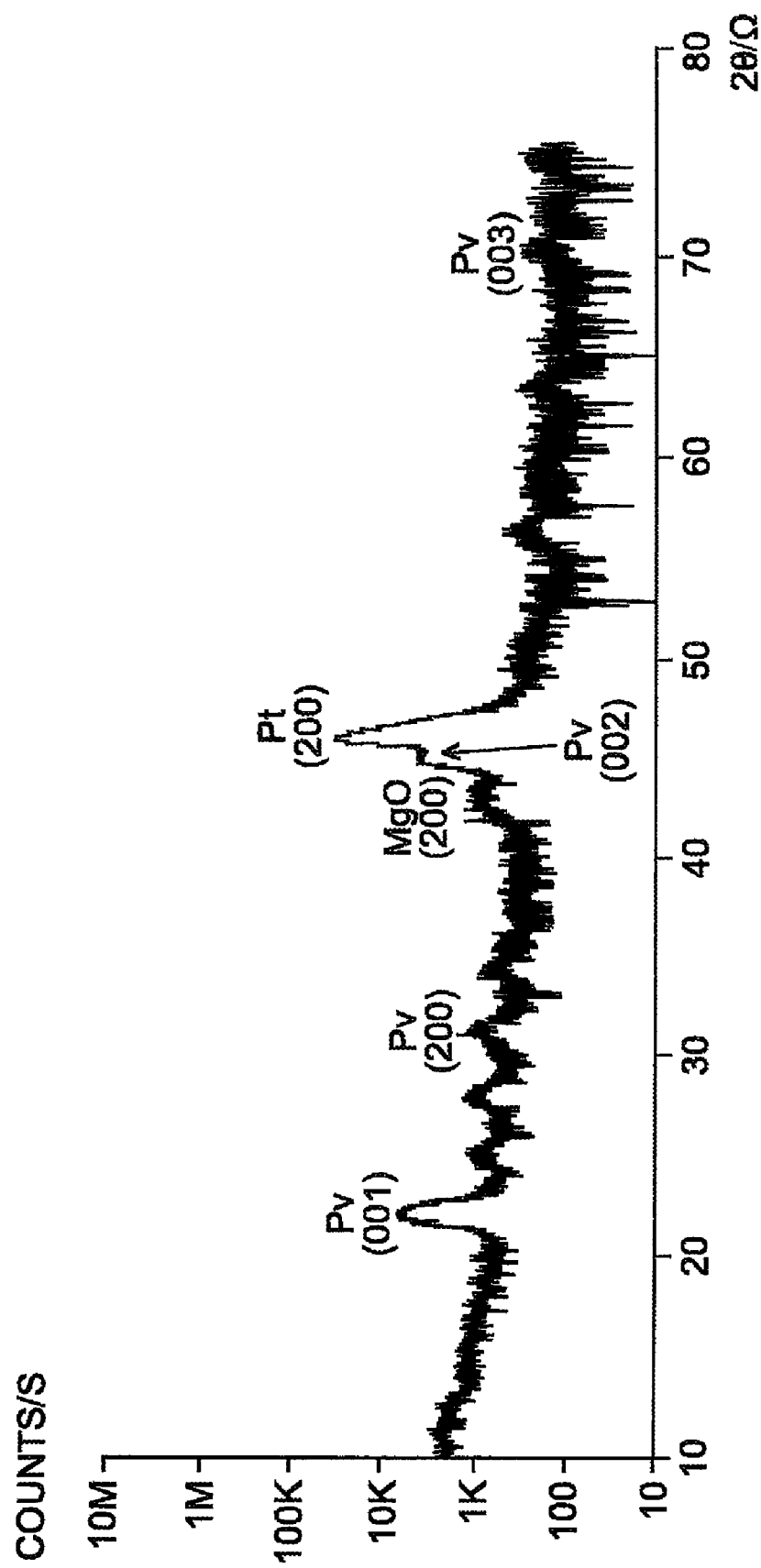
FIG. 5 is a characteristic chart showing the X-ray diffraction pattern provided by the piezoelectric thin-film element in pair art.
Figure 6:
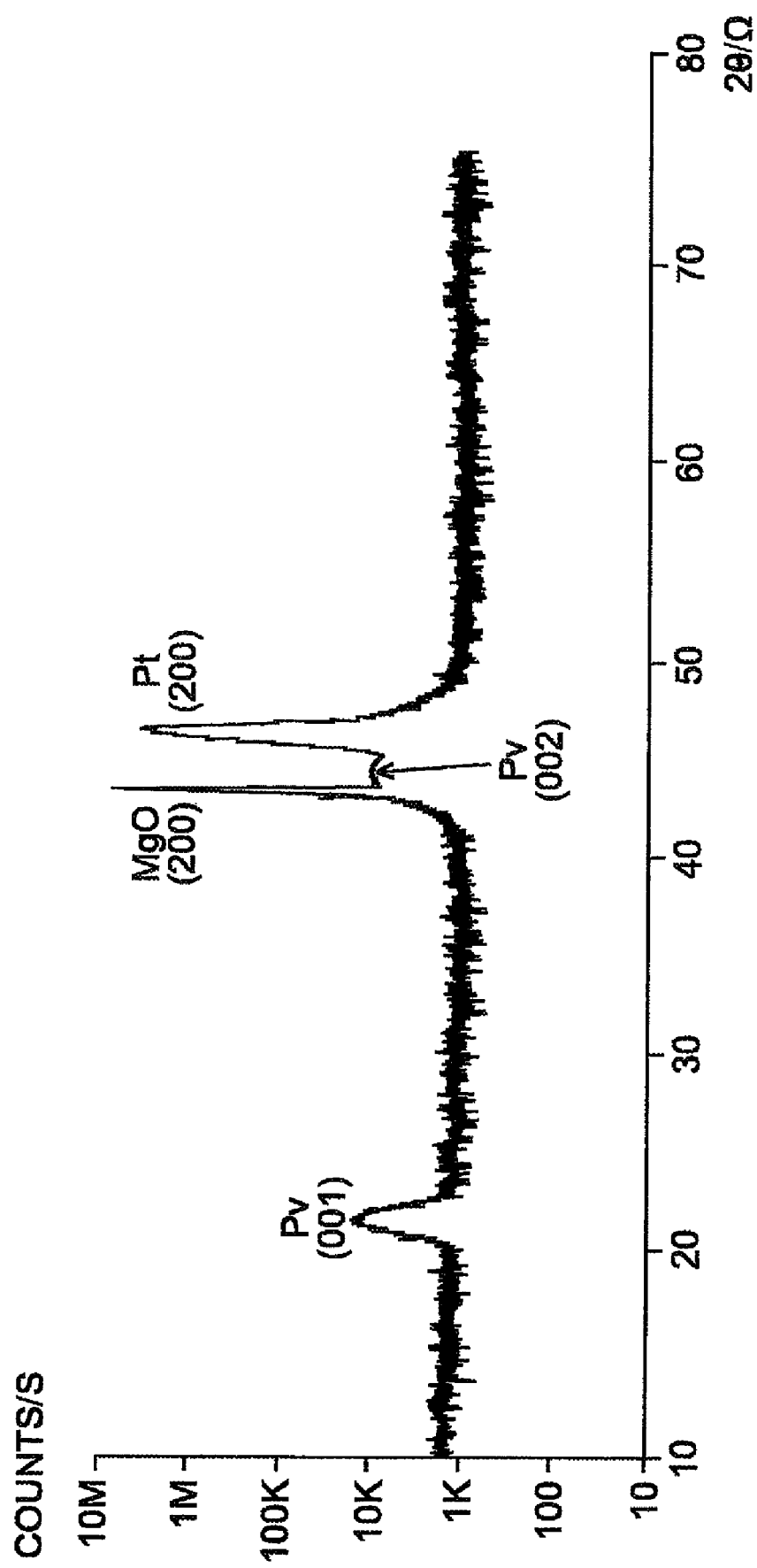
FIG. 6 is a characteristic chart showing the X-ray diffraction pattern provided by the piezoelectric thin-film element in one embodiment.

Next, X-ray diffraction measurement (2θ-ω scan) was performed in order to evaluate the crystalline structure of the piezoelectric films 4 and 22. FIG. 5 shows the X-ray diffraction pattern of the piezoelectric thin-film 22 in the prior art, and FIG. 6 shows the X-ray diffraction pattern of the piezoelectric thin-film 4 in this embodiment. In those figures, the horizontal axis represents twice the angle between the X-ray incident direction and the surface of the substrate (film surface), and the vertical axis represents the count number (counts per second) of the X-ray at its incident direction. In FIGS. 5 and 6, Pv designates a diffraction peak of the Perovskite structure of (Na, K, Li) NbO3, MgO a diffraction peak of the MgO substrate, and Pt a diffraction peak of Pt. Further, a set of numbers in the parenthesis represents an individual crystal plane.

As shown in FIG. 5, there found several diffraction peaks in the X-ray diffraction pattern of the piezoelectric thin-film 22, the intensity of those peaks is very low, and it is proved that a crystalline film having a well-developed Perovskite structure is not formed. On the other hand, as shown in FIG. 6, the distinguished diffraction peaks corresponding to (001) and (002) crystal planes are found, and it is proved that a crystalline film having a well-developed Perovskite structure is formed.

Finally, the piezoelectric thin-film elements 1 and 21 shown in FIGS. 1 and 2 are formed by forming the platinum-based lower electrodes 5 (having the thickness of 0.02 μm) on the piezoelectric thin-films 4 and 22, respectively. The condition for forming the platinum-based lower electrode 5 include no substrate heating, the discharge power of 200 W, the pressure of Ar gas atmosphere of 2.5 Pa and the film-development time of 1 minute.

Next, the piezoelectric characteristics of the piezoelectric thin-film elements 1 and 21 are compared with each other.

Figure 7:
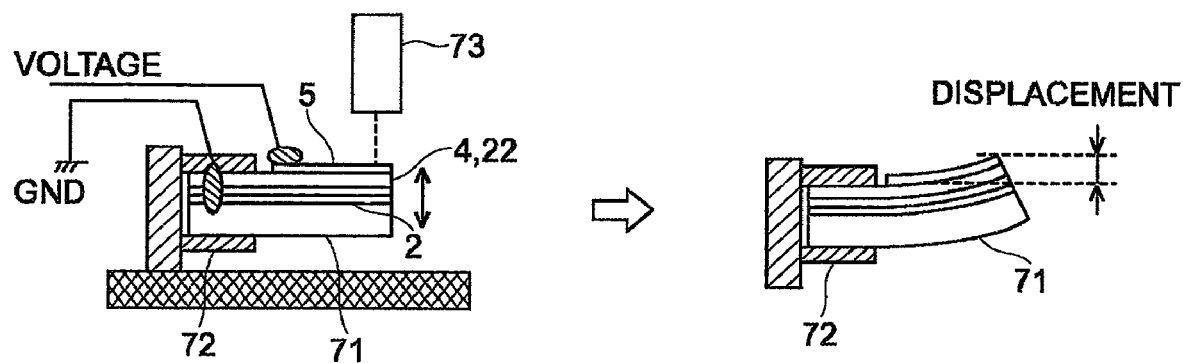
FIG. 7 is a configuration chart showing the test apparatus for evaluating the piezoelectric characteristic.

At first, as shown in FIG. 7, a simple uni-morph cantilever may be formed by cutting the piezoelectric thin-films 1 and 21 into long narrow rectangles 71 with 20 mm in length and 2.5 mm in width, and fixing the end of the long narrow rectangles 71 by the cramp 72. The top of the uni-morph cantilever may be displaced by making the whole of the uni-morph cantilever inflected by expanding and contracting the piezoelectric thin-films 4 and 22 by applying the voltage to the piezoelectric thin-films 4 and 22 between a couple of electrodes 2 and 5. The displacement of the top of the uni-morph cantilever may be measured by the laser Doppler displacement meter 73.

Figure 8:
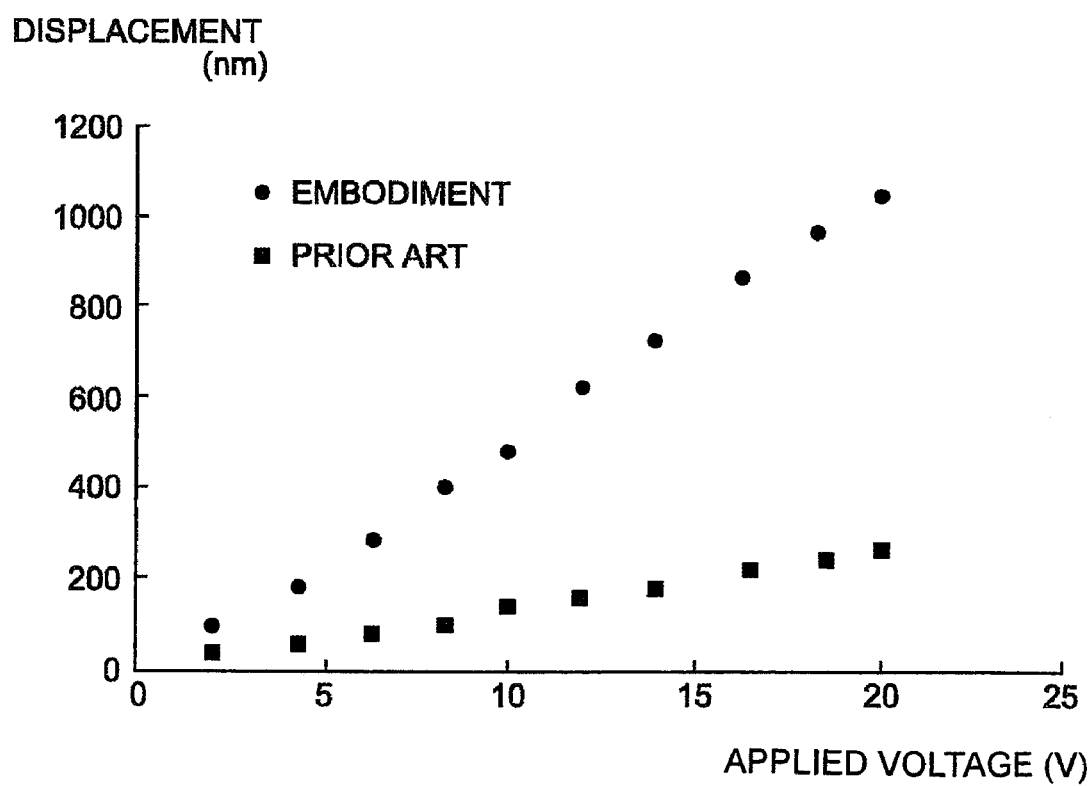
FIG. 8 is a characteristic chart showing the relation between the applied voltage and the piezoelectric displacement.

FIG. 8 shows the relation between the applied voltage and the piezoelectric displacement. According to FIG. 8, it is proved that the piezoelectric displacement of the top of the cantilever in the piezoelectric thin-film element 1 is four times larger than the piezoelectric displacement in the conventional piezoelectric thin-film element 21. In the numerical estimation of the piezoelectric constant $d_{31}$ according to the relation between the applied voltage and the piezoelectric displacement, the piezoelectric constant $d_{31}$ of the piezoelectric thin-film element 21 is −30 pm/V and the piezoelectric constant $d_{31}$ of the piezoelectric thin-film element 1 is −118 pm/V. Thus, it may be confirmed that the present invention can provide the piezoelectric thin-film 4 having more excellent piezoelectric characteristic than the conventional piezoelectric thin-film.

In the above described embodiment, an exemplified structure includes the base dielectric thin-film 6 having a dominant orientation in (001) crystal plane and the piezoelectric thin-film 4 formed on MgO-based substrate 2. Alternatively, the similar effect may be obtained in case of making the piezoelectric thin-film 4 have the dominant orientation in (001) crystal plane or (111) crystal plane with Si-based substrates by taking advantage of self-orientation feature of the base dielectric thin-film 6.

Sensors and actuators using the piezoelectric thin-film element 1 according to the present invention include an ink jet printer, a scanner, a gyroscope, an ultrasonic generator, an ultrasonic sensor, a pressure sensor, a velocity sensor and an accelerator sensor.

The present invention provides niobate lithium potassium sodium thin-films (the base dielectric thin-film 6 and the piezoelectric thin-film 4) formed for the purpose of piezoelectric applications. The applications of niobate lithium potassium sodium thin-films so formed according to the present invention as to have the larger potassium composition and the smaller potassium composition and have a Perovskite structure are not only limited to piezoelectric applications, but also may be extended to various applications such as pyroelectric elements.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments, which can be embodied within a scope encompassed and equivalent thereof with respect to the feature set out in the appended claims.

What is claimed is:

1. A piezoelectric thin-film element having a lower electrode, a piezoelectric thin-film and an upper electrode arranged on a substrate, wherein said piezoelectric thin-film is a dielectric thin-film composed of a alkaline-niobic oxide represented by $(Na_{x1}K_{y1}Li_{z1})$ $NbO_3$ ($0<x1<1$, $0<y1<1$, $0 \leq z1<1$, $x1+y1+z1=1$) and having a Perovskite structure, and a base dielectric thin film composed of a alkaline-niobic oxide represented by $(Na_{x2}K_{y2}Li_{z2})NbO_3$ ($0<x2<1$, $0<y2<1$, $0 \leq z2<1$, $x2+y2+z2=1$) and having a Perovskite structure is provided between said lower electrode and said piezoelectric thin-film.

2. The piezoelectric thin-film element of claim 1, wherein a potassium composition of said base dielectric thin-film, y2, is 0.4 or smaller, and a potassium composition of said piezoelectric thin-film, y1,is 0.4 or larger.

3. A piezoelectric thin-film element having a lower electrode, a piezoelectric thin-film and an upper electrode arranged on a substrate, wherein said piezoelectric thin-film is a dielectric thin-film composed of a alkaline-niobic oxide represented by $(Na_xK_yLi_z)$ $NbO_3$ ($0<x<1$, $0<y<1$, $0 \leq z<1$, $x+y+z=1$)and having a Perovskite structure, and a potassium composition of said piezoelectric thin-film, y, increases in a thickness direction of said piezoelectric thin-film from an area neighboring the lower electrode towards the upper electrode.

4. The piezoelectric thin-film element of claim 3, wherein said potassium composition of said piezoelectric thin-film, y, may increase in the range below 0.4 and over 0.4.

5. The piezoelectric thin-film element of claim 1, wherein said piezoelectric thin-film has a Perovskite structure with a crystalline structure of tetragonal system or orthorhombic system, and its crystal is polycrystalline or monocrystalline and has a dominant orientation in either of (001) crystal plane, (100) crystal plane, (010) crystal plane and (111) crystal plane.

6. The piezoelectric thin-film element of claim 2, wherein said piezoelectric thin-film has a Perovskite structure with a crystalline structure of tetragonal system or orthorhombic system, and its crystal is polycrystalline or monocrystalline and has a dominant orientation in either of (001) crystal plane, (100) crystal plane, (010) crystal plane and (111) crystal plane.

7. The piezoelectric thin-film element of claim 3, wherein said piezoelectric thin-film has a Perovskite structure with a crystalline structure of tetragonal system or orthorhombic system, and its crystal is polycrystalline or monocrystalline and has a dominant orientation in either of (001) crystal plane, (100) crystal plane, (010) crystal plane and (111) crystal plane.

8. The piezoelectric thin-film element of claim 4, wherein said piezoelectric thin-film has a Perovskite structure with a crystalline structure of tetragonal system or orthorhombic system, and its crystal is polycrystalline or monocrystalline and has a dominant orientation in either of (001) crystal plane, (100) crystal plane, (010) crystal plane and (111) crystal plane.

9. The piezoelectric thin-film element of claim 6, wherein said substrate may be either of a magnesium oxide substrate, a silicon substrate, a glass substrate, a stainless substrate, a copper substrate and an aluminum substrate.

10. The piezoelectric thin-film element of claim 8, wherein said substrate may be either of a magnesium oxide substrate, a silicon substrate, a glass substrate, a stainless substrate, a copper substrate and an aluminum substrate.

11. The piezoelectric thin-film element of claim 1, wherein a potassium composition of said base dielectric thin-film, y2, is smaller than a potassium composition of said piezoelectric thin-film, y1.

12. The piezoelectric thin-film element of claim 11, wherein a potassium composition of said piezoelectric thin-film, y1, is about 0.5.

13. The piezoelectric thin-film element of claim 3, wherein potassium composition of said piezoelectric thin-film, y, gradually increases in a thickness direction of said piezoelectric thin-film from an area neighboring the lower electrode towards the upper electrode.

14. The piezoelectric thin-film element of claim 3, wherein potassium composition of said piezoelectric thin-film, y, continuously increases in a thickness direction of said piezoelectric thin-film from an area neighboring the lower electrode towards the upper electrode.

15. The piezoelectric thin-film element of claim 3, wherein potassium composition of said piezoelectric thin-film, y, stepwise increases in a thickness direction of said piezoelectric thin-film from an area neighboring the lower electrode towards the upper electrode.

16. The piezoelectric thin-film element of claim 3, wherein an overall potassium composition of this piezoelectric thin-film, y, is larger than 0.4.

17. The piezoelectric thin-film element of claim 3, wherein an overall potassium composition of this piezoelectric thin-film, y, is about 0.5.

* * * * *